(12) United States Patent
Takasu (10) Patent No.: US 11,011,480 B2
(45) Date of Patent: May 18, 2021

(54) SEMICONDUCTOR DEVICE HAVING A FLAT REGION WITH AN OUTER PERIPHERAL SHAPE INCLUDING CHAMFER PORTIONS

(71) Applicant: ABLIC Inc., Chiba (JP)

(72) Inventor: Hiroaki Takasu, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/442,772

(22) Filed: Jun. 17, 2019

(65) Prior Publication Data

US 2020/0006260 A1 Jan. 2, 2020

(30) Foreign Application Priority Data

Jun. 28, 2018 (JP) .............................. JP2018-123205

(51) Int. Cl.
*H01L 23/64* (2006.01)
*H01L 27/08* (2006.01)
*H01L 27/02* (2006.01)

(52) U.S. Cl.
CPC ........ *H01L 23/647* (2013.01); *H01L 27/0802* (2013.01)

(58) Field of Classification Search
CPC ............... H01L 23/647; H01L 27/0802; H01L 27/0207; H01L 28/20
See application file for complete search history.

(56) References Cited

U.S. PATENT DOCUMENTS

| 4,839,705 | A | * | 6/1989 | Tigelaar | ................ | H01L 27/115 365/185.16 |
| 8,143,730 | B2 | * | 3/2012 | Fukuda | ................... | H01L 24/02 257/790 |
| 2001/0048122 | A1 | * | 12/2001 | Tada | ...................... | H01L 29/405 257/240 |
| 2005/0218478 | A1 | * | 10/2005 | Watanabe | .............. | H01C 7/006 257/536 |
| 2005/0285227 | A1 | * | 12/2005 | Takasu | .................. | H01L 27/016 257/537 |
| 2008/0248601 | A1 | | 10/2008 | Tsukamoto et al. | | |
| 2010/0140714 | A1 | * | 6/2010 | Ren | ..................... | H01L 27/0617 257/368 |
| 2016/0064473 | A1 | * | 3/2016 | Morito | .............. | H01L 21/76816 257/532 |

(Continued)

FOREIGN PATENT DOCUMENTS

JP 2008-198775 8/2008

*Primary Examiner* — Allen L Parker
*Assistant Examiner* — Gustavo G Ramallo
(74) *Attorney, Agent, or Firm* — Brinks Gilson & Lione (57) ABSTRACT

Provided is a semiconductor device capable of improving relative accuracy of semiconductor elements and a yield of a semiconductor integrated circuit device. The semiconductor device includes a flat region formed on a surface of a semiconductor substrate, and having an outer peripheral shape formed by regional sides and regional chamfer portions; an outer peripheral region surrounding the flat region, and having a uniform height different from a height of the flat region; a plurality of semiconductor elements having similar shapes or the same shape, and formed on the flat region; and a wiring metal connecting the plurality of semiconductor elements via contact holes formed in a second insulating film on the semiconductor elements.

4 Claims, 12 Drawing Sheets

(56) References Cited

U.S. PATENT DOCUMENTS

2018/0269270 A1* 9/2018 Hasegawa .............. H01L 28/20
2019/0006460 A1* 1/2019 Chiu ................... H01L 29/0692
2019/0259829 A1* 8/2019 Mun ................... H01L 29/7813

* cited by examiner

PRIOR ART

FIG. 11A

PRIOR ART

FIG. 11B

SEMICONDUCTOR DEVICE HAVING A FLAT REGION WITH AN OUTER PERIPHERAL SHAPE INCLUDING CHAMFER PORTIONS

RELATED APPLICATIONS

Priority is claimed on Japanese Patent Application No. 2018-123205, filed on Jun. 28, 2018, the content of which is incorporated herein by reference.

BACKGROUND OF THE INVENTION

1. Field of the Invention

The present invention relates to a semiconductor device and a semiconductor chip.

2. Description of the Related Art

A semiconductor integrated circuit device such as an analog IC mounted on a semiconductor substrate often uses a semiconductor device obtained by combining a plurality of semiconductor elements having the same or similar shapes to enhance accuracy of output characteristics with the use of high relative accuracy among the plurality of semiconductor elements. For example, a voltage detector uses a voltage comparator to compare a divided voltage of a power supply voltage which is supplied from a bleeder resistor circuit with a reference voltage and provides a signal voltage when the power supply voltage reaches a predetermined detection voltage.

In general, the bleeder resistor circuit is a circuit obtained by combining a plurality of thin film resistive elements having the same shape and divides an applied voltage in accordance with a ratio of resistances of the thin film resistive elements to provide the divided voltage. When the relative accuracy of the thin film resistive elements is low, the divided voltage supplied from the bleeder resistor circuit deviates from a desired value, to thereby cause a deviation of the detection voltage. Accordingly, in the bleeder resistor circuit, since the relative accuracy of the resistances of the thin film resistive elements which are combined to divide the power supply voltage is extremely important, improvement in the relative accuracy of shapes of the plurality of thin film resistive elements having the same shape is required.

In Japanese Patent Application Laid-open No. 2008-198775, there is disclosed a technology which improves a yield of the semiconductor integrated circuit device based on prediction of a variation in relative accuracy of resistances of thin film resistor elements caused by process variations in semiconductor processes from a characteristic variation tendency of a semiconductor integrated circuit device in a surface of a semiconductor substrate, and on adjustment by trimming a bleeder resistor circuit in accordance with the result of the prediction.

The technology for improving the yield of the semiconductor integrated circuit device disclosed in Japanese Patent Application Laid-open No. 2008-198775 is effective if the characteristic variation tendency of the semiconductor integrated circuit device in the surface of the semiconductor substrate is always the same in any semiconductor substrates.

However, in a semiconductor integrated circuit device in which a photoresist is formed on a surface of a semiconductor substrate by a spin coater and semiconductor elements are processed, a tendency of film thickness of the photoresist varies depending on a layout around the semiconductor elements and a size of a step in the surface of the semiconductor substrate. Then, the variation in film thickness tendency has a large influence on the relative accuracy of the semiconductor elements, with the result that the characteristic variation tendency of the semiconductor integrated circuit device is liable to vary.

For that reason, to improve the yield of the semiconductor integrated circuit device, it is required to change the adjustment method such as trimming in accordance with the layout of the semiconductor integrated circuit device, and the size of the step, or the like. Further, the film thickness tendency of the photoresist is also sensitive to a quality change with time, or a device structure and a condition thereof so that a high degree adjustment and complicated management are required to cope with those factors.

SUMMARY OF THE INVENTION

An object of the present invention is to provide a semiconductor device which is capable of improving relative accuracy of a plurality of semiconductor elements, which form a semiconductor device, having the same or similar shapes, and improving a yield of the semiconductor integrated circuit device without a high degree adjustment as in trimming or complicated management, and to provide a semiconductor chip on which a semiconductor integrated circuit device is formed.

The semiconductor device according to the present invention adopts the following configuration to achieve the above-mentioned object.

Specifically, according to one embodiment of the present invention, there is provided a semiconductor device including a flat region formed on a first insulating film formed on a surface of a semiconductor substrate, and having an outer peripheral shape formed by regional sides and regional chamfer portions between the regional sides in plan view; an outer peripheral region surrounding the flat region, and having a height different from a height of the flat region; a plurality of semiconductor elements having one of similar shapes and the same shape, and formed on the flat region at a predetermined distance or longer distance away from the outer peripheral region; a second insulating film formed on the plurality of semiconductor elements; a contact hole formed in the second insulating film on the plurality of semiconductor elements; and a wiring metal formed on the contact hole to connect the plurality of semiconductor elements.

According to the present invention, there is provided a semiconductor device including semiconductor elements formed on a flat region having an outer peripheral shape formed by regional sides and regional chamfer portions, and an outer region having a height different from that of the flat region on the outer periphery of the flat region. As a result, the relative accuracy of the plurality of semiconductor elements having the same shape or similar shapes can be improved, and the yield of a semiconductor integrated circuit device can be improved without performing a high degree adjustment.

DETAILED DESCRIPTION OF THE PREFERRED EMBODIMENTS

Prior to description of embodiments of the present invention, to facilitate understanding of the embodiments, description is made of a variation in film thickness of a semiconductor material made of a viscous material formed on a semiconductor substrate, and an influence on relative accuracy of semiconductor elements caused by the variation in film thickness which have been found by the inventor of the present invention.

Figure 10:
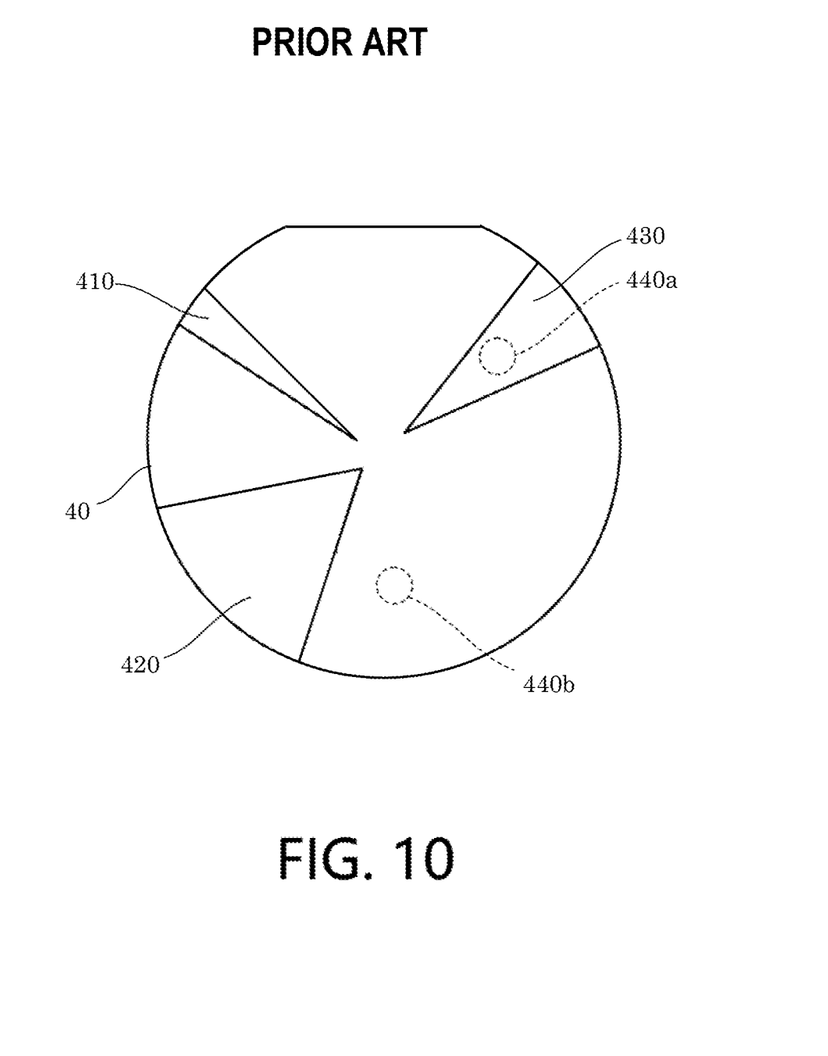
FIG. 10 is a schematic plan view for illustrating striations of a photoresist applied to a semiconductor substrate in related art.

FIG. 10 is an external schematic plan view for illustrating, in a photolithography process for processing and forming semiconductor elements of related art, a surface of a semiconductor substrate 40 having striations formed thereon after a viscous material such as a photoresist is applied by spin coating. When the photoresist is dropped at a center and a stage is rotated, such striations appear as streaks or differences in color based on a difference in thickness of the photoresist. In FIG. 10, regions 410, 420, and 430 are regions in which the film thickness of the photoresist is thicker or a variation thereof is larger than other regions.

When the film thickness of the photoresist varies, line widths and shapes of the resist patterns after processing vary due to, for example, a standing wave effect of irradiation light at a time of exposure, even when photomask patterns having the same shape are used. In formation of a plurality of semiconductor elements having the same or similar shapes, accordingly the line widths and shapes vary due to the variation in resist film thickness on individual semiconductor elements, resulting in a reduction in relative accuracy. For that reason, there occurs a deviation in output characteristics of the semiconductor device which includes the plurality of semiconductor elements.

Figure 11A:
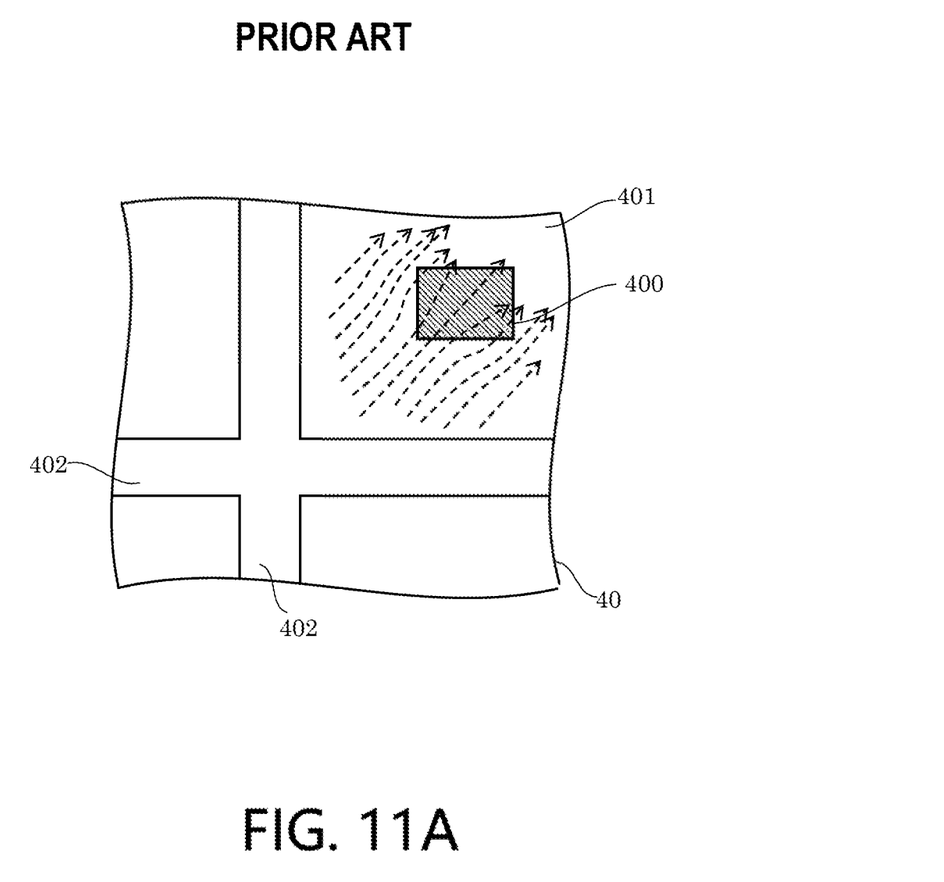
FIG. 11A and FIG. 11B are schematic plan views for illustrating flows of a photoresist applied to a semiconductor substrate in related art.
Figure 11B:
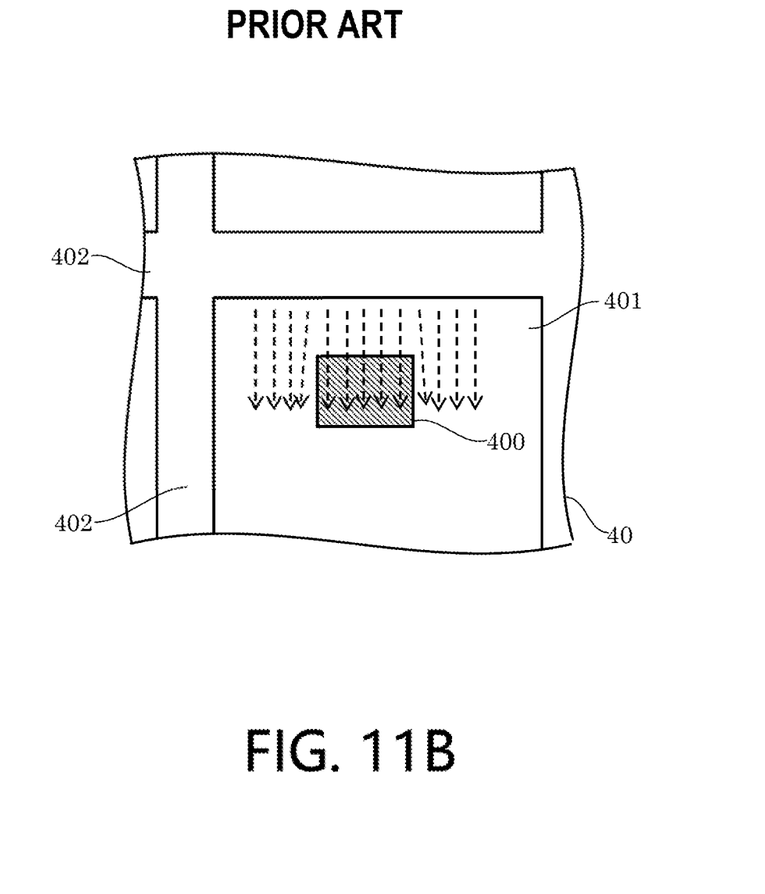

Such a variation in film thickness of the photoresist depends on a difference in height of a step formed in the surface of the semiconductor substrate and a shape of a pattern thereof. FIG. 11A and FIG. 11B are schematic plan views for illustrating respective planes of a region 440a to the upper right of, and a region 440b below a center of the semiconductor substrate 40 illustrated in FIG. 10. For example, in a case where a high step pattern 400 having a height higher than that of a periphery thereof is present in a semiconductor chip 401 surrounded by a scribing region 402 of the semiconductor substrate 40, striations are considered to be formed as described below when the photoresist is formed by spin coating.

In FIG. 11A, a corner portion of the high step pattern 400 faces a flow of the photoresist indicated by dotted arrows from the center of the semiconductor substrate 40 toward an outer periphery thereof. Then, the flow of the photoresist is divided around the corner portion, and hence a disturbance of the flow occurs in a direction toward the outer periphery of the semiconductor substrate 40. A film thickness of the photoresist varies significantly in accordance with the density of the dotted arrows.

Meanwhile, in FIG. 11B, the corner portion of the high step pattern 400 does not face the flow of the photoresist indicated by the dotted arrows, but one side thereof faces the flow so that a disturbance is not liable to occur in the flow of the photoresist. Accordingly, a variation in film thickness of the resist on and around the high step pattern 400 is small.

A pattern in a semiconductor integrated circuit is generally formed to have sides parallel to or perpendicular to an orientation flat. In regions positioned obliquely such as the regions 410, 420, and 430 of FIG. 10 on the semiconductor substrate 40 in the drawing sheet, since a corner portion of the pattern always faces the center of the semiconductor substrate 40, a variation in film thickness of the photoresist is hence liable to occur. Meanwhile, at positions above and below and to the right and left of the semiconductor substrate 40 in the drawing sheet, since the corner portion of the pattern does not face the center, the variation in film thickness of the photoresist is less liable to occur.

The variation in film thickness of the photoresist in the semiconductor device causes variations in line width and shape of a plurality of semiconductor elements having the same photolithographic pattern, and reduces relative accuracy. The present invention has been made based on such findings to suppress the variation in film thickness of a photoresist on a semiconductor device.

In the following, description is made of embodiments of the present invention in detail with reference to the drawings as appropriate. The drawings used in the following description may be partially omitted or enlarged for the sake of easy understanding of features of the present invention and may not be drawn to scale.

First Embodiment

A semiconductor device according to the first embodiment of the present invention is described below.

Figure 1:
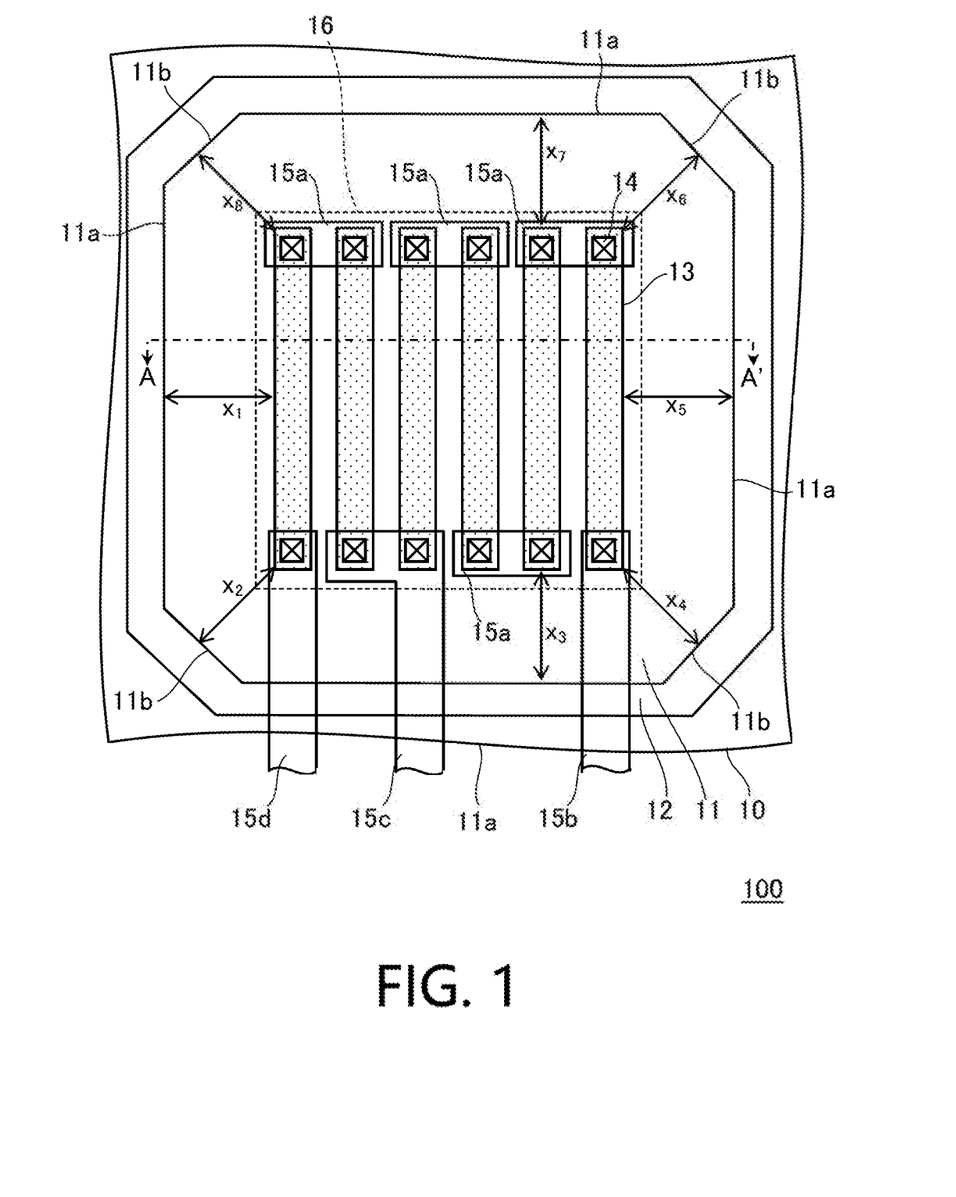
FIG. 1 is a schematic plan view of a semiconductor device according to a first embodiment of the present invention.

FIG. 1 is a schematic plan view for illustrating a semiconductor device 100 according to the first embodiment of the present invention in which some characteristic portions are illustrated in a transparent manner. Further, FIG. 2 is a schematic sectional view of the semiconductor device 100 taken along the line A-A' of FIG. 1.

The semiconductor device 100 according to the first embodiment has a flat region 11 formed on a semiconductor substrate 10 and an outer peripheral region 12 provided around the flat region 11. The flat region 11 has an octagonal outer peripheral shape formed by four regional sides 11a and four regional chamfer portions 11b as seen in plan view and has boundary lines based on the eight sides with respect to the outer peripheral region 12 in a horizontal direction, a vertical direction, and a diagonal direction in the drawing sheet.

A plurality of thin film resistive elements 13 made of polysilicon which have the same shape are formed on the flat region 11 at regular intervals. The thin film resistive elements 13 are formed at a distance $x_1$ and a distance $x_8$ in the horizontal direction, at a distance $x_7$ and a distance $x_3$ in the vertical direction, and at a distance $x_2$, a distance $x_4$, a distance $x_6$, and a distance $x_8$ in the diagonal direction, away from the eight boundary lines. A second insulating film 18 is formed on those thin film resistive elements 13 and contact holes 14 are formed in one end portions and another end portions of the thin film resistive elements 13 in the second insulating film 18. The thin film resistive elements 13 are connected to each other by wiring metals 15a, 15b, 15c, and 15d through the contact holes 14 to form a bleeder resistor circuit 16. As illustrated in FIG. 2, a passivation film 19 is formed on the second insulating film 18. Next, characteristic components of the semiconductor device 100 according to the first embodiment are described.

Figure 2:
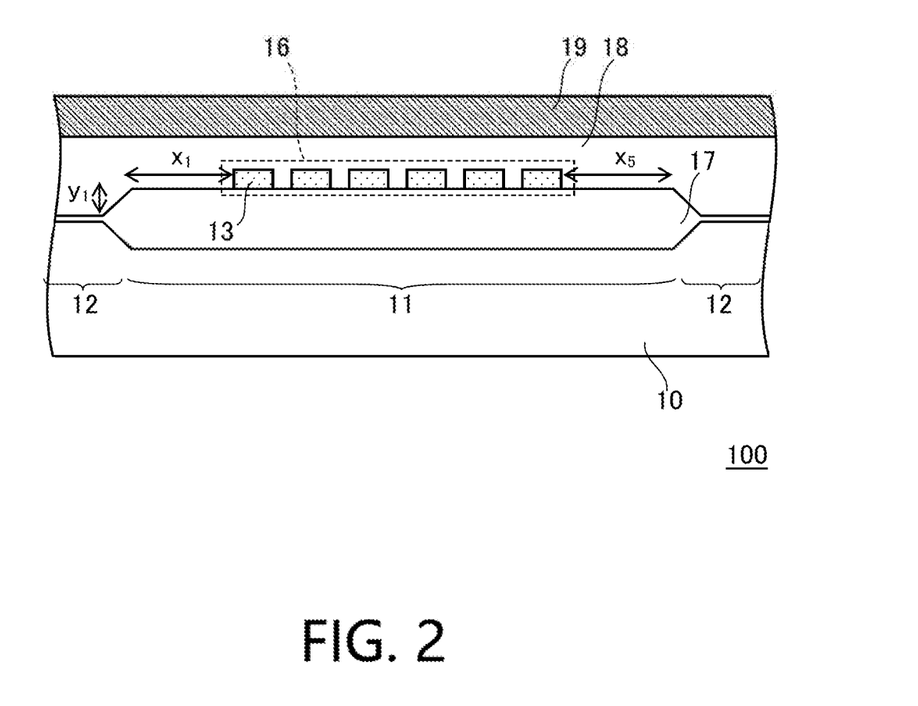
FIG. 2 is a schematic sectional view of the semiconductor device according to the first embodiment.

The flat region 11 is formed at a position higher than the outer peripheral region 12 in a first insulating film 17 with the use of an upper surface of a local oxidation of silicon (LOCOS) oxide film which is an element isolation film as illustrated in FIG. 2. The element isolation film is selected as the first insulating film 17 to insulate and isolate the thin film resistive elements 13 from the semiconductor substrate 10, and to suppress parasitic capacitance, but is not limited thereto as long as a film having a similar function is selected.

The flat region 11 has, as illustrated in FIG. 1, a planar layout so as to suppress an influence of spin coating in formation of a photoresist for processing the thin film resistive elements. That is, in the spin coating, the corner portion which faces the flow of the photoresist flowing from the center of the semiconductor substrate 10 in the diagonal direction is eliminated, and the disturbance of the flow of the photoresist and the variation in film thickness based thereon are suppressed. In addition, the flat region 11 has an obtuse angle of 90 degrees or more as an inner angle of any corner portions formed by the regional sides 11a and the regional chamfer portions 11b, and the disturbance of the resist flow from other directions can be suppressed.

The outer peripheral region 12 has an outer peripheral shape similar to that of the flat region 11, surrounds the outer periphery of the flat region 11 without an interval, and is formed to have an even height lower than that of the flat region 11. In FIG. 2, the upper surface of the LOCOS oxide film for element isolation is the flat region 11, and the outer peripheral region 12 is a region in which the LOCOS oxide film is not formed. Accordingly, a height $y_1$ between the flat region 11 and the outer peripheral region 12 has a size of a step of the LOCOS oxide film. The outer peripheral region 12 is provided for the purpose of alleviating the variation in film thickness of the resist that has flowed from the center of the semiconductor substrate via the surface step of the surface of the semiconductor substrate by allowing the resist to pass a region having the same height in the formation of the photoresist for the thin film resistive elements 13. For that reason, the outer peripheral region 12 may be set evenly higher than the flat region.

Further, as illustrated in FIG. 1, it is preferred that the outer shape of the outer peripheral region 12 have a similar shape to that of the flat region 11, and that each side thereof be arranged parallel to each side of the outer periphery of the flat region 11. However, the present invention is not limited to thereto. The width of the outer peripheral region 12 may be a width of several μm to ten and several μm as a degree with which the variation in film thickness of the photoresist flowing from the center of the semiconductor substrate 10 is alleviated.

The thin film resistive elements 13 are resistive elements that are formed of polysilicon thin films to which impurities are introduced and conductivity is given, and that have resistances determined by the conductivity, the width, and the length. In FIG. 1, a plurality of such thin film resistive elements is all formed to have the same planar shape such as width and length. With the structure as described above, since the respective resistive elements equally receive the shape variation at a time of the etching process of the thin film resistive elements 13, a resistance ratio of the thin film resistive elements 13 can be kept at a constant value based on a shape ratio even when the absolute values of the resistances vary. The thin film resistive elements 13 having such high relative accuracy (resistance ratio close to an ideal value) is effective for improving the yield of the semiconductor integrated circuit device. Further, those thin film resistive elements 13 are formed to have distances ($x_1$ to $x_8$) from each regional side of the flat region 11 that are as long as or longer than a predetermined distance to secure a stable film thickness of the photoresist at a time of forming the thin film resistive elements 13.

Figure 3:
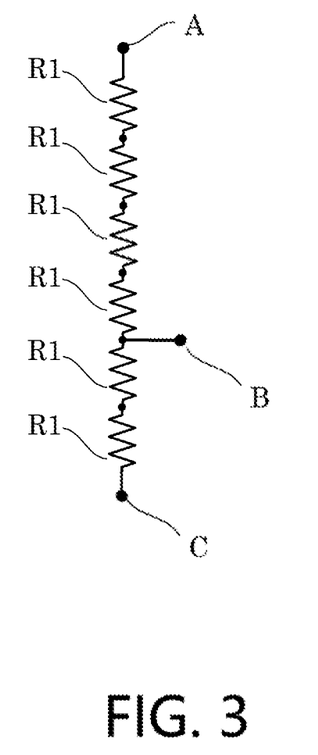
FIG. 3 is a circuit diagram of a bleeder resistor circuit forming the semiconductor device of FIG. 1 and FIG. 2.

The bleeder resistor circuit 16 is a circuit in which the plurality of thin film resistive elements 13 having the same shape are connected by the wiring metals 15a, 15b, 15c, and 15d to divide an applied voltage by a predetermined ratio, and to provide the divided voltage. FIG. 3 is a circuit diagram of the bleeder resistor circuit 16 in which the thin film resistive elements 13 are connected by the wiring metals 15a, 15b, 15c, and 15d. When a voltage is applied between a terminal A and a terminal C, a divided voltage that is ⅓ of the applied voltage is supplied from a terminal B with high accuracy by a ratio of resistances of resistors RI determined by the conductivity and the shapes of the plurality of thin film resistive elements 13.

The bleeder resistor circuit 16 is arranged at a center of the flat region 11 and is formed away from each side of the octagonal flat region 11 by the distances $x_1$ to $x_8$. Those distances are set to alleviate the variation in film thickness of the photoresist which is formed at a step portion between the flat region 11 and the outer peripheral region 12 in application of the photoresist for forming the thin film resistive elements 13.

When the distances from the step portion are sufficiently long, the film thickness of the photoresist becomes constant on the thin film resistive elements. Meanwhile, when the distances are short, the film thickness of the photoresist on the thin film resistive elements varies, and variations in width and length of the thin film resistors occur by an influence of a standing wave at a time of exposure, thereby making it difficult to form thin film resistive elements having the same shape. Then, the voltage division ratio accuracy supplied from the bleeder resistor circuit 16 reduces, and the yield of the semiconductor integrated circuit device reduces. To stabilize the shape of the thin film resistive elements 13, it is important that the distances $x_1$ to $x_8$ are given sufficient lengths, and, at the time of application of the photoresist for forming the thin film resistive elements, that the flat region 11 is kept flat without arranging any structures such as transistors formed of polysilicon thin films, wirings, and fuses thereon.

The distances $x_1$ to $x_8$ required for stability of the photoresist film thickness are associated with the film thickness of the photoresist and the height $y_1$ of FIG. 2. That is, it is known that, as the step becomes smaller, the distances required for film thickness stabilization also become shorter. Further, the distances are also associated with the film thickness of the photoresist at the time of forming the thin film resistive elements 13. The distances $x_1$ to $x_8$ are thus set based on the selected manufacturing process conditions.

Further, though not shown, a well region or the like is formed on a lower surface of the first insulating film 17 in the semiconductor substrate 10 as required, and the region is set at a constant potential, with the result that the resistances of the thin film resistive elements 13 made of polysilicon can be stabilized by a field effect. The potential of the well region is desirably set at, for example, a ground voltage Vss or a power supply voltage Vdd applied to the semiconductor integrated circuit device.

Figure 4A:
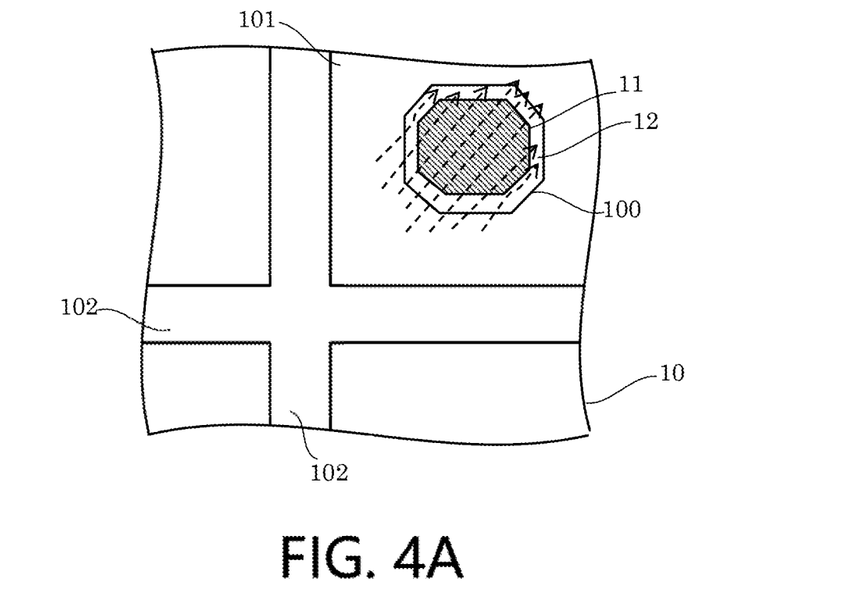
FIG. 4A and FIG. 4B are schematic plan views for illustrating flows of a photoresist applied to a semiconductor substrate of the first embodiment.
Figure 4B:
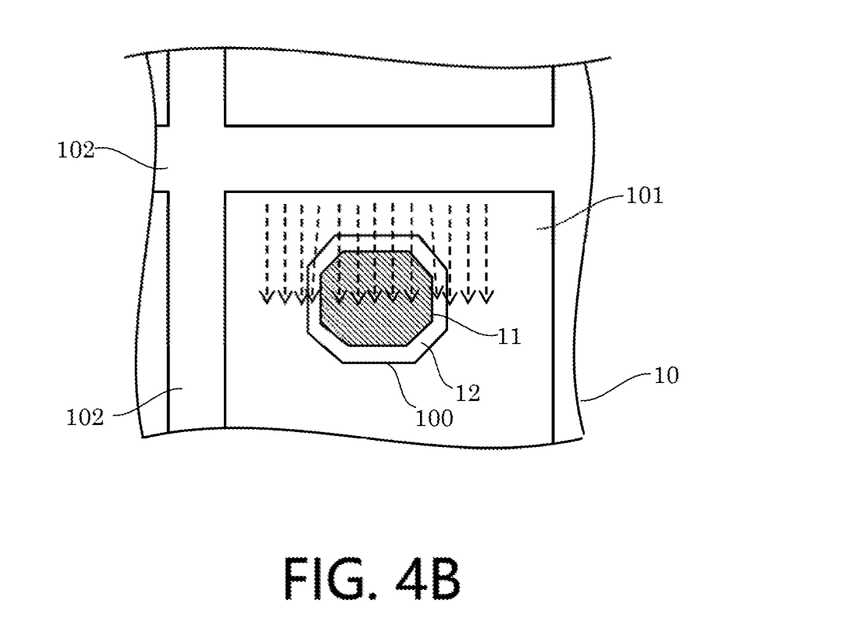

FIG. 4A and FIG. 4B are partial schematic plan views in which semiconductor chips 101 are arranged on the semiconductor substrate 10 with a scribing region 102 interposed between the semiconductor chips 101. Each semiconductor chip 101 includes the semiconductor device 100 having the flat region 11 and the outer peripheral region 12 of the first embodiment. Only characteristic portions are illustrated. The positions on the semiconductor substrate 10 of FIG. 4A and FIG. 4B correspond to the regions 440a and 440b of FIG. 10, respectively. As illustrated in FIG. 4A, the flat region 11 does not have a corner portion that forms an angle of 90 degrees to face the photoresist flowing diagonally from a lower left direction illustrated by dotted arrows, a disturbance of film thickness distribution is less liable to occur as in FIG. 4B. Accordingly, evenness in film thickness of the photoresist on regions in which the thin film resistive elements are later formed on the flat region 11 is improved, and an improvement in yield of the semiconductor integrated circuit device can be achieved as well as an improvement in relative accuracy of the plurality of thin film resistive elements.

To equally improve the evenness in film thickness of the photoresist of FIG. 4A and the evenness in film thickness of the photoresist of FIG. 4B, it is preferred that lengths of the four sides in the diagonal directions and lengths of the four sides in the vertical and horizontal directions of the flat region 11 be the same with each other. At this time, the lengths of $x_2$, $x_4$, $x_6$, and $x_8$ of FIG. 1 are shorter than the lengths of $x_1$, $x_3$, $x_5$, and $x_7$. The lengths of $x_2$, $x_4$, $x_6$, and $x_8$ are thereby set to sufficient lengths to overcome the influence caused by a variation in film thickness of the photoresist.

With the structure described above, as illustrated in FIG. 4A and FIG. 4B, in the photolithography process for forming the thin film resistive elements, the evenness in film thickness of the photoresist on the thin film resistive elements is improved at any position on the semiconductor substrate, and the relative accuracy of the thin film resistive elements is improved.

Next, description is made of a semiconductor integrated circuit device including the semiconductor device of the first embodiment.

Figure 5:
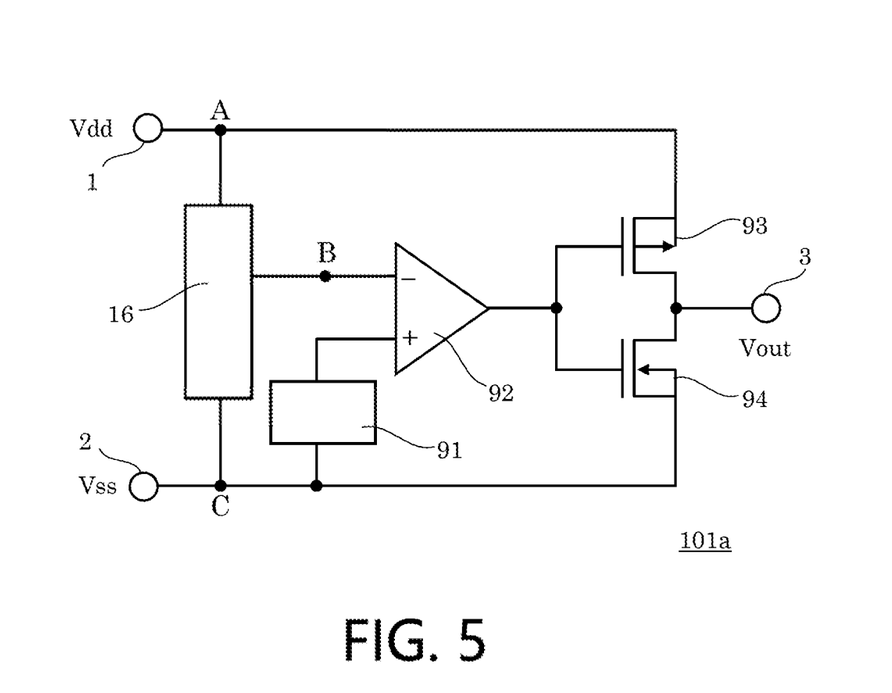
FIG. 5 is a circuit block diagram of a voltage detector according to an embodiment of the present invention.

FIG. 5 is a schematic circuit block diagram of a voltage detector 101a including the bleeder resistor circuit of the first embodiment.

The voltage detector 101a includes the bleeder resistor circuit 16, a reference voltage circuit 91, a voltage comparator 92, a P-channel transistor 93, and an N-channel transistor 94. Further, the voltage detector 101a is an analog IC configured to provide an output voltage Vout from an output terminal 3 as a detection signal when the power supply voltage Vdd applied to a power supply terminal 1 varies with respect to the ground voltage Vss applied to a ground terminal 2 and reaches a predetermined detection voltage.

The bleeder resistor circuit 16 to which the power supply voltage Vdd is supplied from the terminal A and the ground voltage Vss is supplied from the terminal C, provides a divided voltage of a difference between the two voltages from the terminal B. The voltage comparator 92 provides, as a voltage, a result of comparison between the divided voltage output from the bleeder resistor circuit 16 and a reference voltage output from the reference voltage circuit 91. An output circuit formed by the P-channel transistor 93 and the N-channel transistor 94 provides the output voltage Vout as the detection signal based on the voltage output from the voltage comparator 92. Through adoption of the bleeder resistor circuit 16 of the first embodiment, accuracy in divided voltage of the power supply voltage rises, and an improvement in detection accuracy of the voltage detector 101a can thus be achieved.

Figure 6:
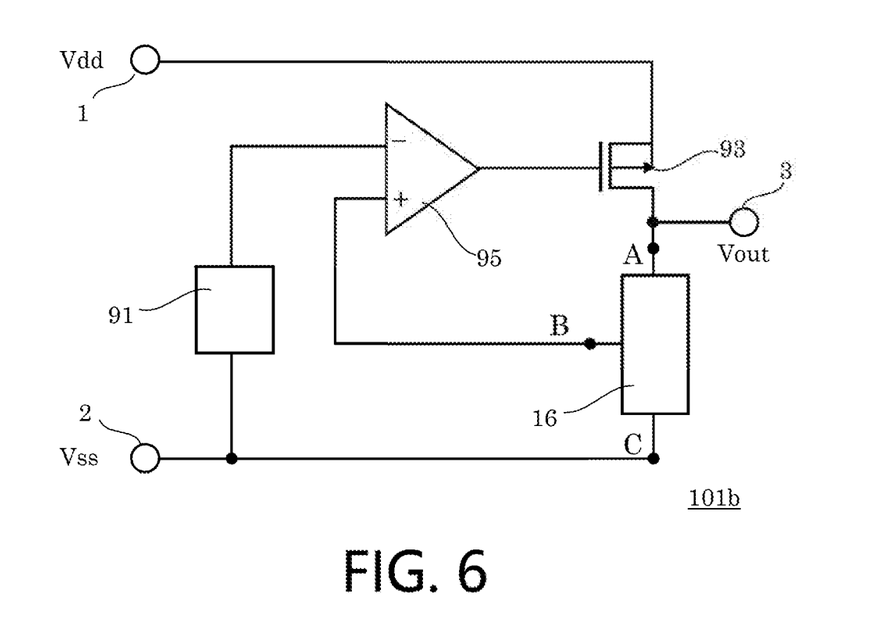
FIG. 6 is a circuit block diagram of a voltage regulator according to an embodiment of the present invention.

FIG. 6 is a schematic circuit block diagram of a voltage regulator 101b including the bleeder resistor circuit of the first embodiment.

The voltage regulator 101b includes the bleeder resistor circuit 16, the reference voltage circuit 91, an error amplifier 95, and the P-channel transistor 93. The voltage regulator 101b is an analog IC configured to provide a predetermined constant voltage as the output voltage Vout from the output terminal 3 even when the power supply voltage Vdd applied to the power supply terminal 1 varies with respect to the ground voltage Vss applied to the ground terminal 2.

When the output voltage Vout to the terminal A varies with respect to the ground voltage Vss to the terminal C, the divided voltage supplied from the terminal B of the bleeder resistor circuit 16 varies. The error amplifier 95 amplifies a voltage of the difference between the divided voltage and the reference voltage supplied from the reference voltage circuit 91 to provide the amplified voltage. Then, the error amplifier 95 adjusts a gate voltage of the P-channel transistor 93 based on the output voltage and controls to suppress the variation in the output voltage Vout. Through adoption of the bleeder resistor circuit 16 of the first embodiment, accuracy in divided voltage of the output voltage Vout rises, and an improvement in detection accuracy of the voltage regulator 101b can thus be achieved.

As described above, through adoption of the bleeder resistor circuit of the first embodiment to a semiconductor integrated circuit device such as the voltage detector or the voltage regulator, accuracy in output voltage is improved, and an improvement in yield of the semiconductor integrated circuit device can be achieved.

Second Embodiment

A semiconductor device according to a second embodiment of the present invention is described below.

Figure 7:
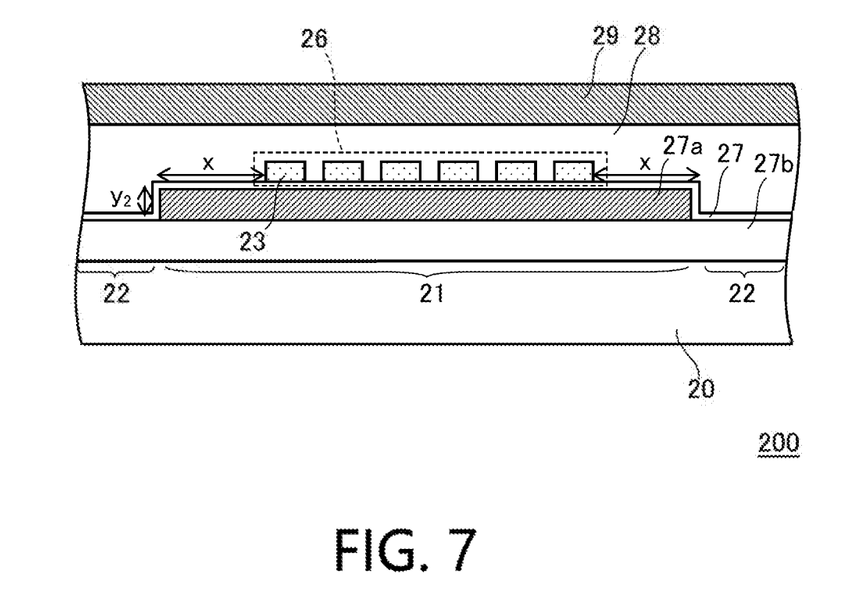
FIG. 7 is a schematic sectional view of a semiconductor device according to a second embodiment of the present invention.

FIG. 7 is a schematic sectional view for illustrating a semiconductor device 200 according to a second embodiment of the present invention. The structure as seen in plan view of the second embodiment is similar to that of FIG. 1, and the schematic sectional view of FIG. 7 corresponds to a sectional view taken along the line A-A' of FIG. 1.

The semiconductor device 200 of the second embodiment has, as a flat region 21, a region in which a conductive film 27a is formed on a base insulating film 27b formed on the semiconductor substrate 20. Further, an outer peripheral region 22 is provided around the flat region 21, and the conductive film 27a is not formed in the outer peripheral region 22. A first insulating film 27 is formed over the conductive film 27a in the flat region 21 and the outer peripheral region 22. A plurality of thin film resistive elements 23 made of polysilicon having the same shape are formed at regular intervals on the flat region 21. Planar shapes of the flat region 21 and the thin film resistive elements 23 are similar to those of the first embodiment. A second insulating film 28 is formed on the thin film resistive elements 23, and a passivation film 29 is formed on the second insulating film 28. The plurality of thin film resistive elements 23 are connected to each other by wiring metals (not shown) through contact holes (not shown) to form a bleeder resistor circuit 26. Characteristic portions of the second embodiment with respect to the first embodiment are mainly described below.

The bleeder resistor circuit 26 is arranged at a center of the flat region 21, and is formed away from the outer periphery of the flat region 21 by respective distances x. Those distances are set to alleviate a variation in film thickness of the photoresist formed at a step between the flat region 21 and the outer peripheral region 22 in photoresist formation by spin coating for forming the thin film resistive elements 23. Such a structure is similar to that of the first embodiment.

The flat region 21 is a region in which the conductive film 27a is formed on the base insulating film 27b such as an element isolation film, and the first insulating film 27 is further formed on the conductive film 27a. The flat region 21 is provided at a higher position than the outer peripheral region 22 by a height $y_2$, but the height $y_2$ is substantially equal to a thickness of the conductive film 27a.

In the first embodiment, a difference in height between the outer peripheral region 12 and the flat region 11 is restricted by the thickness of the LOCOS oxide film which is also used as an element isolation film. However, a difference in height between the outer peripheral region 22 and the flat region 21 in the second embodiment can be freely set by a thickness of the conductive film 27a. The second embodiment has thus an advantage that a degree of freedom is high in terms of a setting of the distances x for making the film thickness of the photoresist constant in the formation of the thin film resistive elements 23.

Further, the conductive film 27a is formed on the base insulating film 27b that is continuous from the outer peripheral region 22, but the base insulating film 27b is not limited to the LOCOS oxide film and may be another insulating film, to thereby further increase the degree of freedom in structure setting.

The outer peripheral region 22 is a region in which the conductive film 27a is not formed. The outer peripheral region 22 surrounds an entire outer periphery of the flat region 21 and is formed at an even height lower than the flat region 21. The outer peripheral region 22 has the structure in which the first insulating film 27 is laminated on the base insulating film 27b, and the outer shape is not required to have a similar shape to the flat region 21. Other semiconductor element may be directly formed at a distance from several μm to 10 and several μm.

It is advantageous to form the conductive film 27a using the same material as the gate electrode of the MOS transistor used in the semiconductor integrated circuit device, because manufacturing steps do not increase. Then, through fixation of the potential of the conductive film 27a constant, the resistances of the thin film resistive elements 23 made of polysilicon can be stabilized by the field effect. For example, it is desired that the potential of the conductive film 27a be fixed to the ground voltage Vss or the power supply voltage Vdd.

With the structure described above, similar to FIG. 4A and FIG. 4B of the first embodiment, in the photolithography process for forming the thin film resistive elements, evenness in film thickness of the photoresist on the thin film resistive elements is improved, and relative accuracy of the thin film resistive elements is improved. Further, the difference in height between the flat region and the outer peripheral region can be freely set so that the distances from the outer periphery of the flat region to the bleeder resistor circuit can be freely controlled.

Third Embodiment

Description is made below of a semiconductor device and a semiconductor integrated circuit device according to a third embodiment of the present invention.

Figure 8A:
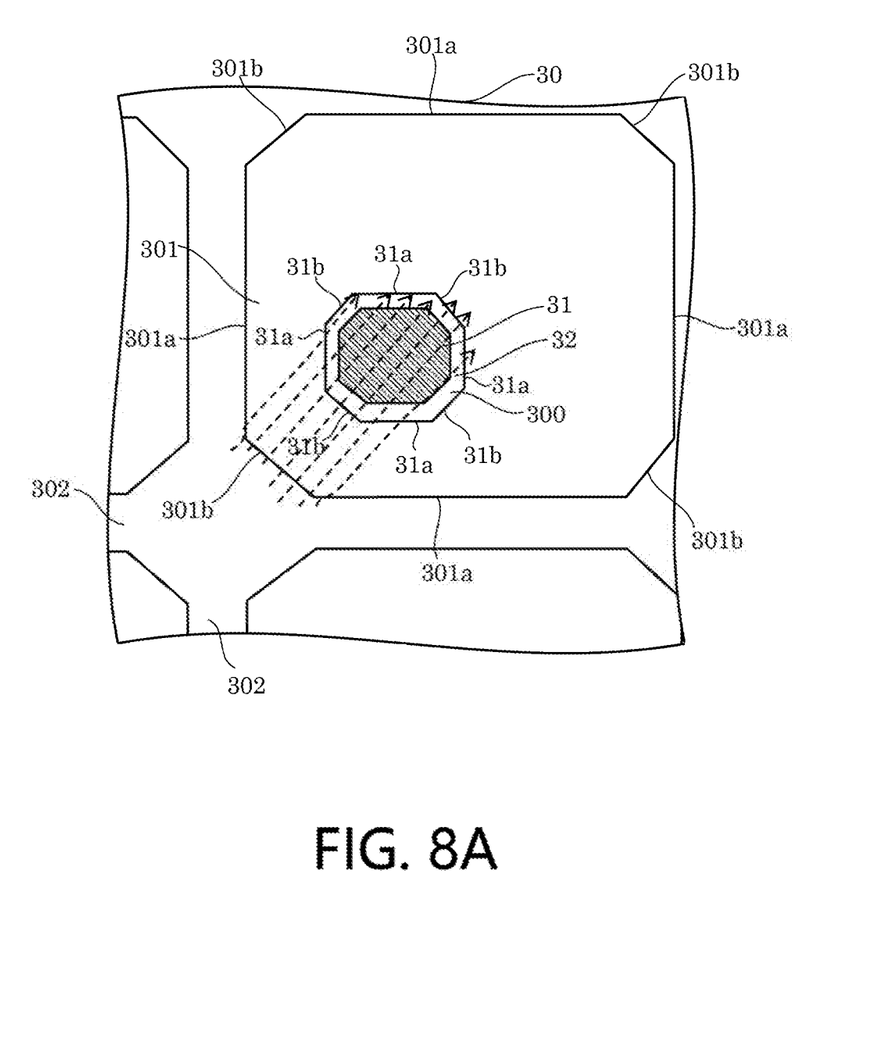
FIG. 8A and FIG. 8B are schematic plan views for illustrating flows of a photoresist applied to a semiconductor substrate of a third embodiment of the present invention.
Figure 8B:
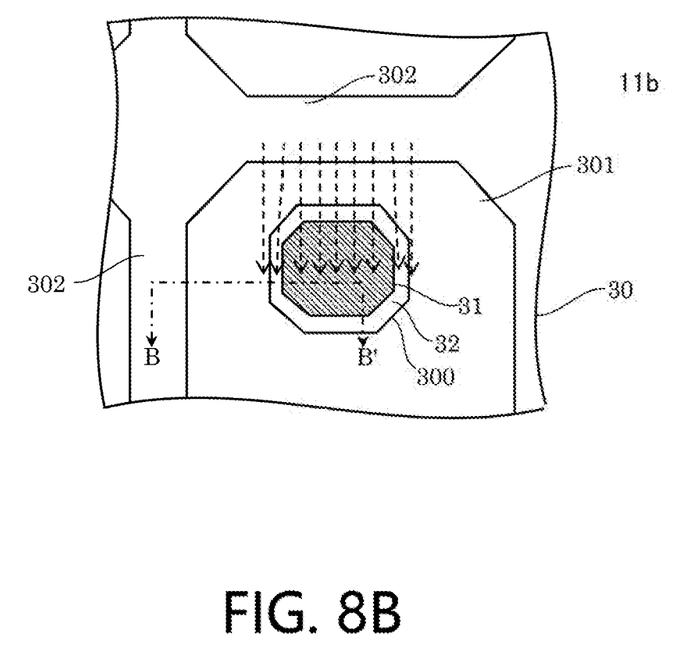
Figure 9:
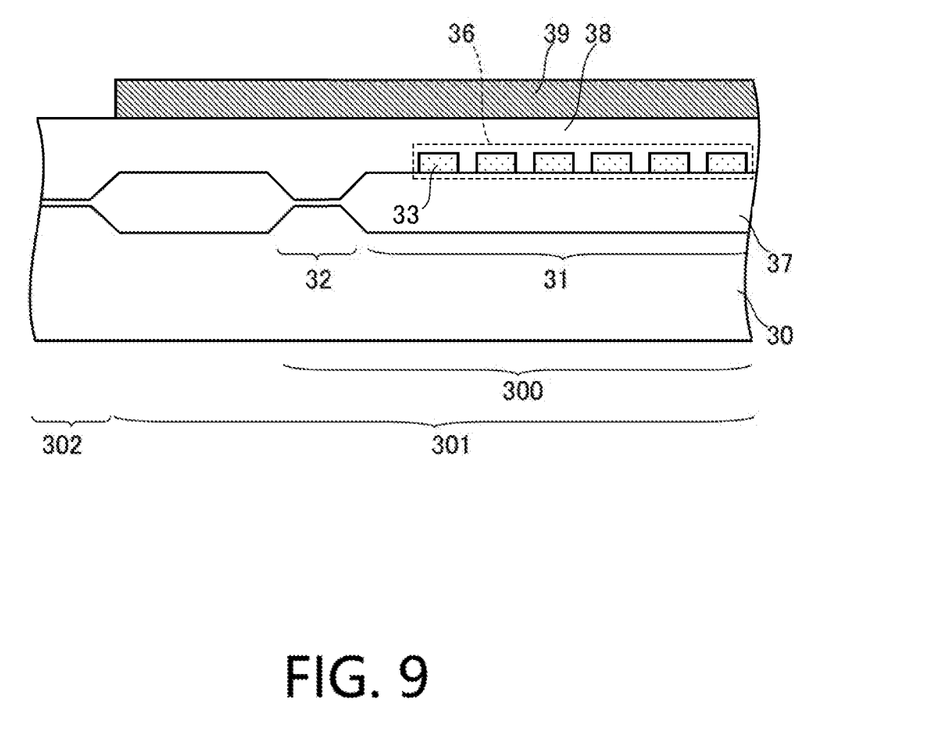
FIG. 9 is a schematic sectional view of a semiconductor device according to the third embodiment.

FIG. 8A and FIG. 8B are partial schematic plan views in which semiconductor chips 301 are mounted on a semiconductor substrate 30 with a scribing region 302 interposed between the semiconductor chips 301. Each semiconductor chip 301 includes a semiconductor device 300 according to the third embodiment of the present invention. Only characteristic portions are illustrated. The positions on the semiconductor substrate 30 of FIG. 8A and FIG. 8B correspond to the regions 440a and 440b of FIG. 10, respectively. Further, FIG. 9 is a schematic sectional view of portions of the semiconductor chip 301 and of the scribing region 302 taken along the line B-B' of FIG. 8B. Characteristic portions of the third embodiment with respect to the first embodiment are mainly described below.

The semiconductor device 300 has a similar structure to that of FIG. 1 as seen in plan view and has a flat region 31 having an octagonal outer peripheral shape formed by four regional sides and four regional chamfer portions, and an outer peripheral region 32 having an octagonal outer shape surrounding the flat region 31 without an interval. As illustrated in FIG. 8A and FIG. 8B, each side of the outer periphery of the outer peripheral region 32 is arranged parallel to each side of the outer periphery of the flat region 31. As illustrated in FIG. 9, the flat region 31 is formed at a position higher than the peripheral region 32 in the first insulating film 37 with the use of an upper surface of a LOCOS oxide film for element isolation. Thin film resistive elements 33, a second insulating film 38, and a passivation film 39 are formed above the flat region 31. The thin film resistive elements 33 are connected to each other by wiring metals (not shown) through contact holes (not shown) to form a bleeder resistor circuit 36. An outer side of the outer peripheral region 32 which is a region in which the LOCOS oxide film is not formed is surrounded by the LOCOS oxide film.

The semiconductor chip 301 includes a semiconductor integrated circuit device therein, and as illustrated in FIG. 8A, includes the semiconductor device 300 having the flat region 31 having an octagonal shape formed by four regional sides 31a and four regional chamfer portions 31b. Further, an outer peripheral shape of the semiconductor chip 301 is an octagonal shape formed by four chip sides 301a and four chip chamfer portions 301b and has boundary lines based on the eight sides with respect to the scribing region 302 in the horizontal direction, the vertical direction, and the diagonal direction in the drawing sheet. The chip sides 301a of the semiconductor chip 301 are arranged parallel to the regional sides 31a of the flat region 31. Further, the chip chamfer portions 301b of the semiconductor chip 301 are arranged parallel to the regional chamfer portions 31b of the flat region 31.

The scribing region 302 is a region for cutting by a dicing blade or the like in the singularization of the semiconductor chip 301. To enhance an efficiency of the cutting by the dicing blade, an insulating film on the semiconductor substrate 30 is formed by, in general, a minimally required film. In the scribing region 302, accordingly, a region in which the LOCOS oxide film is not formed is used in place of a region in which the LOCOS oxide film is formed, and further the passivation film 39 is removed.

As illustrated in FIG. 8A, in the photolithography process for forming thin film resistive elements, the flat region 31 does not have a corner portion that forms an angle of 90 degrees to face the flow of the photoresist illustrated by dotted arrows. As in the case of FIG. 8B, a disturbance in film thickness distribution of the photoresist on regions in which the thin film resistive elements are later formed is therefore less liable to occur as in the first embodiment.

Further, in the third embodiment, since a corner portion based on a LOCOS oxide film is not formed on an outer periphery of the semiconductor chip 301 to face the flow of the photoresist indicated by the dotted arrows, in FIG. 8A, the disturbance of the photoresist film thickness distribution which occurs before the photoresist reaches the flat region 31 can be suppressed, making it possible to further improve evenness in film thickness of the photoresist on the regions in which the thin film resistive elements are later formed. As a result, an improvement in yield of the semiconductor integrated circuit device can be achieved as well as an improvement in relative accuracy of the plurality of thin film resistive elements.

As described above, when there is a step having a corner portion that forms an angle of 90 degrees or less with respect to the photoresist flowing into the semiconductor chip, a variation in film thickness of the photoresist is liable to occur. For that reason, the outer peripheral shape of the semiconductor chip is not limited to an octagonal shape, and any shape is effective for suppression of the variation in film thickness of the photoresist as long as an internal angle defined between the chip side and the chip chamfer portion exceeds 90 degrees.

The present invention is not limited to the above-mentioned embodiments, and it should be understood that various modifications and combinations thereof are possible without departing from the gist of the present invention.

For example, the flat region 11 of semiconductor device 100 illustrated in FIG. 1 is formed in an octagonal shape formed by the four regional chamfer portions and the four regional sides, but a similar effect can be obtained even when the flat region 11 is a polygon having more corner portions. Alternatively, the shape of the regional chamfer portion may be a curve forming a convex shape toward the outer peripheral region. Further, similarly to the regional chamfer portion, the regional side may also be a curve forming a convex shape toward the outer periphery, and the flat region may have an outer peripheral shape that is a circular shape or an elliptical shape.

Still further, similarly to the flat region, it should be understood that the shape of the chip chamfer portion in the semiconductor chip may be a curve forming a convex shape toward the scribing region.

Meanwhile, the plurality of thin film resistive elements 13 of FIG. 1 all have the same shape, but thin film resistive elements having similar shapes of different sizes may be combined. The present invention can exhibit a high effect even in a bleeder resistor circuit configured to provide a divided voltage with use of a shape ratio of such similar shapes.

Further, in the embodiments described above, the semiconductor elements, the semiconductor device, and the semiconductor integrated circuit device have been described as the thin film resistive elements, the bleeder resistor circuit, and the voltage detector or the voltage regulator, respectively, but are not limited thereto. For example, the semiconductor elements may be memory elements or image sensors, and the semiconductor device may be a memory array or an imaging device. That is, the present invention can be applied to a semiconductor device for which an improvement in relative accuracy of a plurality of semiconductor elements having the same or similar shapes is required, and a yield of a semiconductor integrated circuit device including the semiconductor device can be improved.

What is claimed is:

1. A semiconductor device, comprising:
    a flat region formed on a first insulating film formed on a surface of a semiconductor substrate, and the first insulating film having an outer peripheral shape formed by regional sides and regional chamfer portions between the regional sides in plan view;
    an outer peripheral region surrounding the flat region, and having a height different from a height of the flat region;
    a plurality of semiconductor elements having one of similar shapes or the same shape, and formed on the flat region at a predetermined distance or longer distance away from the outer peripheral region;
    a second insulating film formed on the plurality of semiconductor elements;
    a contact hole formed in the second insulating film on the plurality of semiconductor elements; and
    a wiring metal formed on the contact hole to connect the plurality of semiconductor elements to each other;
    wherein each of the regional chamfer portions has a shape of a straight line as seen in plan view, and an inner angle defined by one of the regional sides and one of the regional chamfer portions is an angle exceeding 90 degrees.

2. The semiconductor device according claim 1, further comprising a conductive film formed between the semiconductor substrate below the flat region and the first insulating film.

3. The semiconductor device according to claim 1, wherein the semiconductor elements include thin film resistive elements, and the semiconductor device includes a bleeder resistance circuit.

4. A semiconductor chip having the semiconductor device according to claim 1 and formed on the semiconductor substrate, the semiconductor chip comprising:
    chip sides divided by a scribing region, and chip chamfer portions provided between the chip sides as seen in plan view,
    the chip sides being provided in a direction substantially parallel to the regional sides facing the chip sides.

* * * * *